US011537319B2

(12) United States Patent
Ashkar et al.

(10) Patent No.: US 11,537,319 B2
(45) Date of Patent: Dec. 27, 2022

(54) CONTENT ADDRESSABLE MEMORY WITH SUB-FIELD MINIMUM AND MAXIMUM CLAMPING

(71) Applicant: ADVANCED MICRO DEVICES, INC., Santa Clara, CA (US)

(72) Inventors: Alexander Fuad Ashkar, Orlando, FL (US); James R. Klobcar, Orlando, FL (US); Harry J. Wise, Orlando, FL (US)

(73) Assignee: ADVANCED MICRO DEVICES, INC., Santa Clara, CA (US)

(*) Notice: Subject to any disclaimer, the term of this patent is extended or adjusted under 35 U.S.C. 154(b) by 0 days.

(21) Appl. No.: 16/710,563

(22) Filed: Dec. 11, 2019

(65) Prior Publication Data
US 2021/0181973 A1 Jun. 17, 2021

(51) Int. Cl.
*G06F 3/06* (2006.01)
*G11C 15/04* (2006.01)

(52) U.S. Cl.
CPC .......... *G06F 3/0659* (2013.01); *G06F 3/0604* (2013.01); *G06F 3/0673* (2013.01); *G11C 15/04* (2013.01)

(58) Field of Classification Search
None
See application file for complete search history.

(56) References Cited

U.S. PATENT DOCUMENTS

| | | | | |
|---|---|---|---|---|
| 5,167,029 A * | 11/1992 | Eikill | .................. | G06F 13/4234 365/189.08 |
| 5,438,535 A * | 8/1995 | Lattibeaudiere | ... | H04N 7/17336 365/49.17 |
| 5,995,967 A * | 11/1999 | Iacobovici | .......... | G06F 16/9024 |
| 6,876,559 B1 | 4/2005 | Rathnavelu et al. | | |
| 7,418,543 B2 * | 8/2008 | Jain | ........................ | G11C 15/00 365/49.1 |
| 7,782,645 B1 | 8/2010 | Gaddam et al. | | |
| 8,990,657 B2 * | 3/2015 | Moyer | .................. | H03M 13/13 714/763 |
| 9,055,114 B1 * | 6/2015 | Talaski | .................... | H04L 69/22 |
| 10,340,007 B2 | 7/2019 | Salama et al. | | |
| 2006/0236205 A1 * | 10/2006 | Kuramoto | ........... | G06F 11/1016 714/763 |
| 2018/0019006 A1 | 1/2018 | Brandl et al. | | |

FOREIGN PATENT DOCUMENTS

WO 03038625 A1 5/2003

OTHER PUBLICATIONS

International Search Report and Written Opinion dated Apr. 8, 2021 for PCT/US2020/064478, 10 pages.
International Preliminary Report on Patentability, dated Jun. 23, 2022 for PCT/US2020/064478, 6 pages.

* cited by examiner

*Primary Examiner* — Elias Mamo

(57) ABSTRACT

A processing system includes a content addressable memory (CAM) in an input/output path to selectively modify register writes on a per-pipeline basis. The CAM compares an address of a register write to an address field of each entry of the CAM. If a match is found, the CAM modifies the register write data as defined by a function for the matching entry of the CAM. In some embodiments, each entry of the CAM includes a data mask defining subfields of the register write data, wherein each subfield includes subfield data including one or more bits.

18 Claims, 6 Drawing Sheets

CONTENT ADDRESSABLE MEMORY WITH SUB-FIELD MINIMUM AND MAXIMUM CLAMPING

BACKGROUND

Processing systems receive data and commands from applications and input/output (I/O) devices at registers and other storage modules. As next generation processing systems are developed, an important design consideration is providing compatibility with older applications and I/O devices. For example, data and commands generated by an application could conflict with new functionality, thereby negatively impacting user experience. In addition, bug fix workarounds may need to set or clear register bits. Data can be manipulated at runtime using firmware or flash microcode to ensure backward compatibility. However, if data is manipulated using firmware, for each register write, the firmware applies an address test to determine if a potential modification of the data is needed and perform the modification if necessary. This requires multiple clock cycles, and the number of clock cycles needed increases with the number of addresses that must be checked. Thus, analyzing data while a program is running to reset or clear register bits in firmware or flash microcode is time intensive, and exacts a performance penalty that can potentially negatively impact the user experience.

BRIEF DESCRIPTION OF THE DRAWINGS

The present disclosure is better understood, and its numerous features and advantages made apparent to those skilled in the art by referencing the accompanying drawings. The use of the same reference symbols in different drawings indicates similar or identical items.

DETAILED DESCRIPTION

Figure 1:
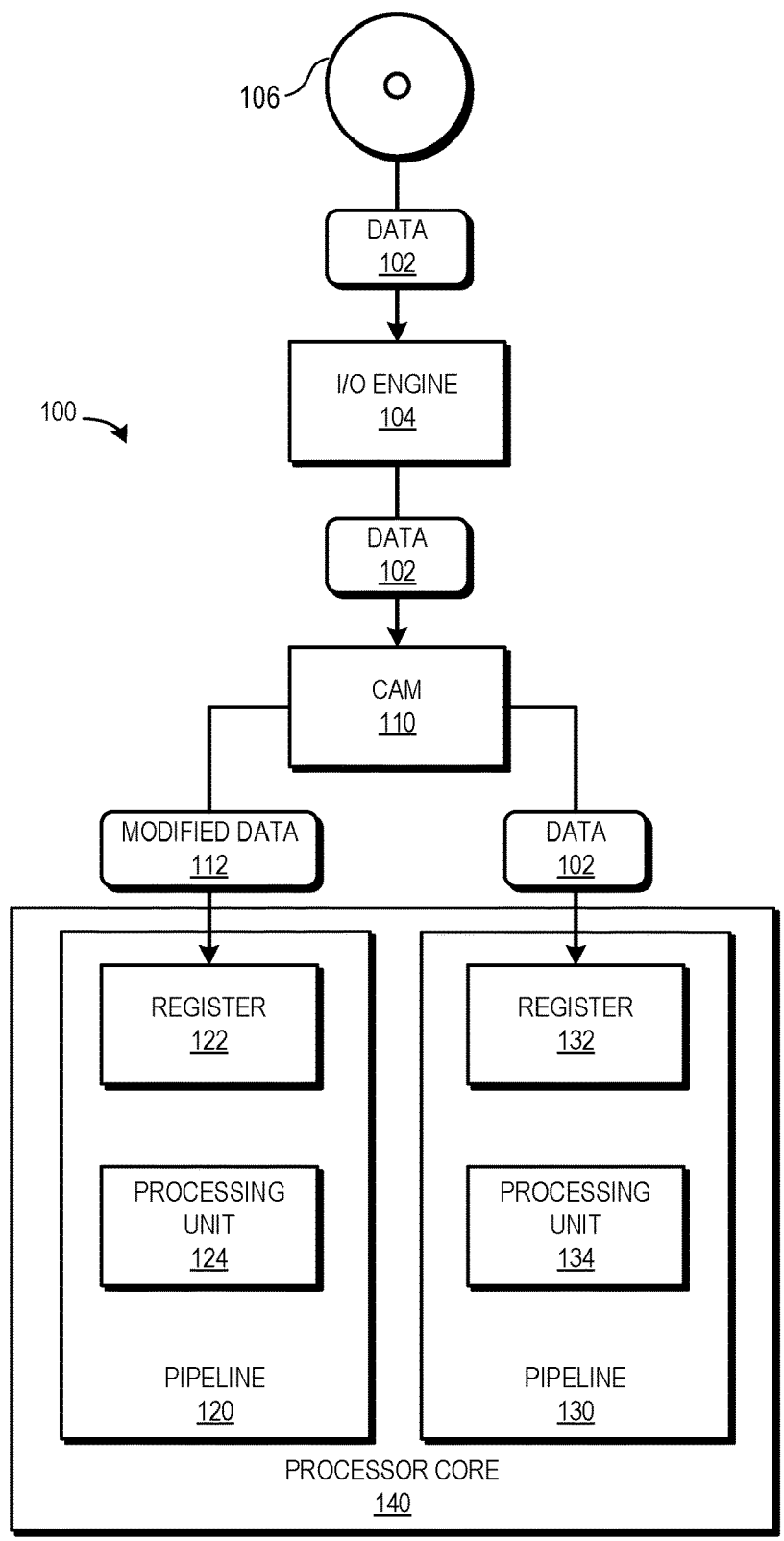
FIG. 1 is a block diagram of a processing system including a content addressable memory (CAM) to modify register writes to one or more pipeline registers in accordance with some embodiments.

FIGS. 1-6 illustrate example hardware systems and techniques for selectively modifying register writes received from existing software to match next generation hardware. A processing system including multiple processing pipelines has a CAM in an I/O path to selectively modify register writes on a per-pipeline basis. The CAM compares an address of a register write to an address field of each entry of the CAM. In response to determining that the address of the register write matches an address field of an entry of the CAM, the CAM selectively modifies the register write as defined by a function for the matching entry of the CAM. For example, in some embodiments a function for the matching entry is a replace function, in response to which the CAM replaces the value of the data of the register write with data stored at the CAM for the matching entry (i.e., a modified value). In some embodiments, the function for the matching entry is a minimum clamp, in which the data of the register write is compared to a minimum value stored at the CAM for the matching entry and is replaced with the minimum value of the value of the register write data is less than the minimum value. Conversely, in some embodiments, the function for the matching entry is a maximum clamp, in which the data of the register write is compared to a maximum value stored at the CAM for the matching entry and is replaced with the maximum value if the value of the register write data exceeds the maximum value.

The CAM selectively modifies or discards register writes on a per-pipeline basis, so that for a valid CAM entry, the CAM modifies or discards the register write for a first pipeline but leaves the register write unmodified for a second (or third, etc.) pipeline. In some embodiments, for a given address, each pipeline has a different CAM entry such that the register writes for the pipelines are modified independently.

The CAM further includes, in some embodiments, a data mask for each entry, this data mask defining subfields of the register write. For example, in some embodiments, the register write data includes 32 bits and the data mask defines bit positions belonging to each subfield. Each subfield defined by each entry's data mask can include a single bit or multiple bits. The CAM further includes a subfield function for each subfield and subfield data or a subfield value for each subfield. Thus, if the subfield function for a first subfield is a replace function, the CAM replaces the bit values of the data for the bit positions defined by the data mask with the subfield data for the matching CAM entry (e.g., flips each 0 to 1 and flips each 1 to 0). Similarly, if the subfield function for the first subfield is a minimum clamp, the CAM compares the value of the bit positions of the subfield of the data defined by the data mask with the subfield value for the matching CAM entry and clamps the value of the data subfield to the subfield value for the matching CAM entry if the value of the data subfield is less than the subfield value for the matching CAM entry. If the subfield function for the first subfield is a maximum clamp, the CAM compares the value of the bit positions of the subfield of the data defined by the data mask with the subfield value for the matching CAM entry and clamps the value of the data subfield to the subfield value for the matching CAM entry if the value of the data subfield is greater than the subfield value for the matching CAM entry.

In addition, in some embodiments, each CAM entry includes an indication that a second (or third) subfield function is to be performed on a second (or third) subfield of the data write. For example, if a continue bit is set for a first slot of a CAM entry having multiple subfields, and an address of a register write matches the address field of the CAM entry, a first subfield function is performed on a first subfield of the data of the register write, and the next (second) slot of the CAM entry is used to perform a second subfield function on the first subfield or a second subfield of the data. If a continue bit is set for the second slot of the CAM entry, a third subfield function is performed on one of the first subfield, the second subfield, or the third subfield of the data. To illustrate, if the first subfield function is a replace function for a first subfield, the second subfield function is a minimum clamp for a second subfield, and the third subfield function is a maximum clamp for a third subfield, the CAM replaces bits of the first subfield of the data, clamps to a minimum a value of the second subfield, and clamps to a maximum a value of the third subfield, all using a single CAM lookup and compare. If the minimum clamp and maximum clamp are applied to the same subfield, the CAM limits the value of the corresponding subfield. Thus, the continue bit(s) chain together operations such that multiple operations are performed on different ranges of bits of a single register write. By using the CAM to selectively modify register writes, data generated by existing software can be modified to match next generation hardware without a noticeable performance penalty.

FIG. 1 is a block diagram of processing system 100 including a content addressable memory (CAM) 110 configured to modify register writes from an external storage medium 106 to one or more pipeline registers in accordance with some embodiments. The processing system includes an interface such as an input/output (I/O) engine 104, and two pipelines, pipeline 120 and pipeline 130. Pipeline 120 includes a register 122 and a processing unit 124. Likewise, pipeline 130 includes a register 124 and a processing unit 134. The processing system 100 executes one or more sets of instructions (e.g., computer programs) to perform specified tasks for an electronic device. Examples of such tasks include controlling aspects of the operation of the electronic device, displaying information to a user to provide a specified user experience, communicating with other electronic devices, and the like. Accordingly, in different embodiments the processing system 100 is employed in one of a number of types of electronic devices, such as a desktop computer, laptop computer, server, game console, tablet, smartphone, and the like.

To support execution of the one or more sets of instructions, the processing system 100 includes a plurality of processor cores (only one of which, processor core 140, is shown at FIG. 1 for ease of illustration). In some embodiments, each processor core includes one or more instruction pipelines (e.g., pipeline 120 and pipeline 130) to fetch instructions, decode the instructions into corresponding operations, dispatch the operations to one or more execution units (e.g., processing units 124, 134), execute the operations, and retire the operations. Although the FIG. 1 illustrates two pipelines 120, 130, other embodiments include one pipeline or more than two pipelines. In the course of executing instructions, the processor cores generate graphics operations and other operations associated with the visual display of information. Based on these operations, the processor cores provide commands and data to a graphics processing unit (GPU) (not shown).

The I/O engine 104 handles input or output operations associated with a display (not shown), as well as other elements of the processing system 100 such as keyboards, mice, printers, external disks, and the like. In the illustrated embodiment, the I/O engine 104 reads information stored on an external storage medium 106, such as a compact disk (CD), a digital video disk (DVD), and the like. The external storage medium 106 stores information representative of program code used to implement an application such as a video game. The program code on the external storage medium 106 is written to register 122 of pipeline 120 to form a copy of instructions or the program code that are to be executed by the processing unit 124. Likewise, the program code on the external storage medium 106 is written to register 132 of pipeline 130 to form a copy of instructions or the program code that are to be executed by the processing unit 134.

To facilitate selective modification of register writes from the external storage medium to the registers 122, 132, the processing system includes the CAM 110. The CAM 110 is configured to selectively modify data of register writes on a per-pipeline basis, such that for a first pipeline a register write is modified, and for a second pipeline the register write is unmodified, or is modified differently from the modification for the first pipeline. In some embodiments, the CAM 110 is configured to apply a data mask to a register write to an address matching an address of an entry of the CAM 110. The data mask defines subfields of the register write and specifies a subfield function, or opcode, to be performed on the bits of the register write (i.e., subfield) corresponding to the data mask. In some embodiments, the CAM 110 is configured to store an indication (e.g., a continue bit) that a second subfield function (i.e., an additional operation) is to be performed on the register write, either at the same subfield or a different subfield of the register write. Each entry of the CAM 110 includes an address field, a data mask, a function select field identifying an opcode, data value subfields, pipeline enable bits for each pipeline, and a continue bit if more than one function is to be performed on a single register write. In some embodiments, each entry of the CAM 110 includes a function select field for each subfield. In some embodiments, each entry of the CAM 110 further includes an indication to discard register write data. If the indication, such as a skip write, is set, the CAM 110 modifies the address output to a reserved register address for register writes that are to be discarded by the hardware.

The function select field includes replace, minimum clamp, and maximum clamp functions. In response to the replace function being specified for a subfield of bits defined by the data mask, the CAM 110 replaces bits of the register write data 102 that have a corresponding data mask bit set with the corresponding data value subfield of the matching CAM 110 entry. Thus, for example, if the data mask is 0xffff0000, the data value subfield of the matching CAM 110 entry is 0xccddeeff, and the register write data 102 is 0x12345678, the modified value will be 0ccdd5678. In response to the minimum clamp function being specified for a subfield of bits defined by the data mask, the CAM 110 compares the value of the subfield of the register write data 102 to the corresponding data value subfield of the matching CAM 110 entry. If the value of the subfield of the register write data 102 is less than the corresponding data value subfield of the matching CAM 110 entry, the CAM 110 clamps the value of the subfield of the register write data 102 to the data value subfield of the matching entry. In response to the maximum clamp function being specified for a subfield of bits defined by the data mask, the CAM 110 compares the value of the subfield of the register write data 102 to the corresponding data value subfield of the matching CAM 110 entry. If the value of the subfield of the register write data 102 is greater than the corresponding data value subfield of the matching CAM 110 entry, the CAM 110 clamps the value of the subfield of the register write data 102 to the data value subfield of the matching entry. Thus, the CAM 110 selectively modifies subfields of the register write data 102.

To illustrate, in operation, the I/O engine 104 receives register write data 102 from the external storage medium 106. The I/O engine 104 provides the register write data 102 to the CAM 110. The CAM 110 performs a lookup to compare the address of the register write data 102 to the address fields of each entry of the CAM 110. In some embodiments, when searching the CAM 110 for a match, the first match found starting with entry 0 is used, and a match at a higher entry is ignored. If a match is found and at least one pipeline is enabled, for example, by setting a pipeline enable bit, the CAM 110 modifies the register write data 102 as defined by the data mask and subfield function and data fields for the matched CAM 110 entry. If a pipeline is not enabled, the CAM 110 refrains from modifying the data 102. Thus, in the illustrated example, the CAM 110 includes a match for the address of data 102 and the pipeline enable bit for pipeline 120 is set for the matching entry. The CAM 110 therefore modifies the data 102 for pipeline 120 and provides modified data 112 to register 122. However, in the illustrated example, the pipeline enable bit for pipeline 130 is not set, so the CAM 110 does not modify the data 102 for pipeline 130 and provides the data 102 to register 132.

Figure 2:
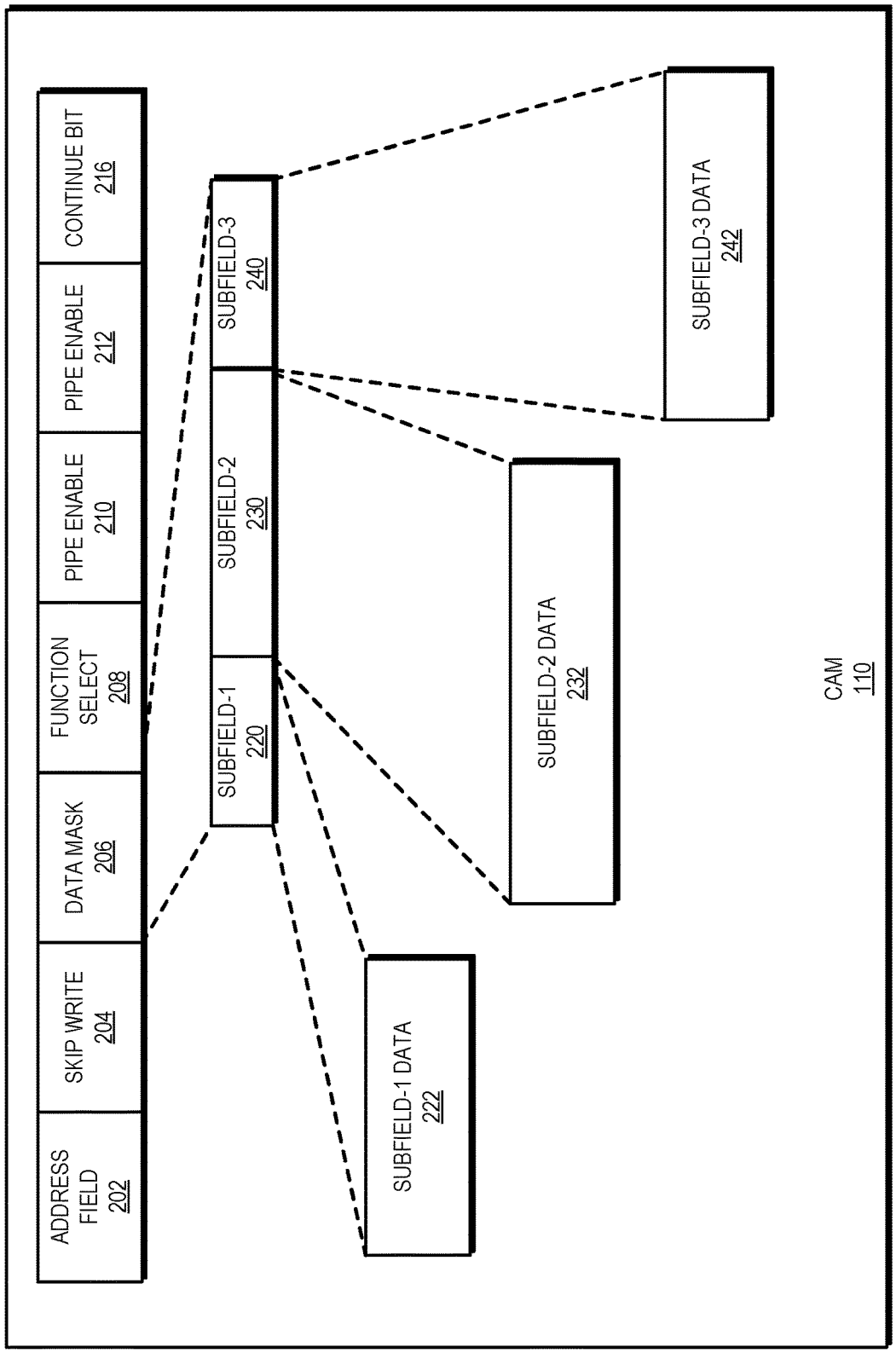
FIG. 2 is a block diagram of the CAM of FIG. 1 including a data mask defining subfields of a register write and a subfield function and subfield data corresponding to each subfield in accordance with some embodiments.

FIG. 2 is a block diagram of the CAM 110 of FIG. 1 including a data mask 206 defining subfields of register write data and subfield data corresponding to each subfield in accordance with some embodiments. In the illustrated example, each entry of the CAM 110 includes an address field 202, a skip write field 204, a data mask 206, a function select 208, a pipeline enable 210, a pipeline enable 212, and a continue bit 216. When set, the skip write field 204 modifies the register address output from the CAM 110 for the register write data to an address that is discarded by the hardware. The data mask 206 defines three subfields of the register write data matching the address field 202 of the entry of the CAM 110: subfield-1 220, subfield-2 230, and subfield-3 240. Each subfield includes one or more bits and are independently sized. Thus, in the illustrated example, subfield-1 220 includes fewer bits than subfield-2 230, and subfield-3 240 includes more bits than subfield-1 220 but fewer bits than subfield-2 230. In some embodiments, bit positions that are set define the last bit of a subfield. For example, a new subfield begins when the mask bit for the next higher number bit is set. For 32-bit data, bit 31 starts a subfield and bit 0 ends a subfield. Starting from most significant bit 31, if a bit of the data mask 204 is 0, either a new subfield is starting or it is the middle of a subfield. If a bit of the data mask 204 is 1, it is the last bit of the subfield.

The matching entry of the CAM 110 includes a function select 208, which identifies a function, or opcode, to be performed on the bits of the register write data (not shown) corresponding to the bits identified by the data mask 206. In some embodiments, the function select 208 is one of a replace function, a minimum clamp function, or a maximum clamp function. The subfield-1 data value 222 is used to either replace the values of the bits of the register write data corresponding to subfield-1 220 (in the case that the function select 208 is a replace function) or to clamp the values of the bits of the register write data corresponding to subfield-1 220 (in the case that the function select 208 is a minimum or maximum clamp function and the value of the "subfield-1" register write data either is less than or exceeds the value of the subfield-1 data value 222). The continue bit 216 being set indicates that the CAM 110 is to perform a second function on the register write data matching the address field 202. Accordingly, a second CAM slot, subfield-2 230 is used to perform the second function.

Similar to subfield-1 220, the function select 208 identifies a function, or opcode, to be performed on the bits of the register write data corresponding to the bits identified by the data mask 206 as subfield-2 230. The subfield-2 data value 232 is used to either replace the values of the bits of the register write data corresponding to subfield-2 230 (in the case that the function select 208 is a replace function) or to clamp the values of the bits of the register write data corresponding to subfield-2 230 (in the case that the function select 208 is a minimum or maximum clamp function and the value of the "subfield-2" register write data either is less than the minimum value or exceeds the maximum value of the subfield-2 data 232). The continue bit 216 being set indicates that the CAM 110 is to perform a third function on the register write data matching the address field 202. Accordingly, a third CAM slot, subfield-3 240 is used to perform the third function.

As with subfield-1 220 and subfield-2 230, the function select 208 identifies a function, or opcode, to be performed on the bits of the register write data corresponding to the bits identified by the data mask 206 as subfield-3 240. The subfield-3 data value 242 is used to either replace the values of the bits of the register write data corresponding to subfield-3 240 (in the case that the function select 208 is a replace function) or to clamp the values of the bits of the register write data corresponding to subfield-3 240 (in the case that the function select 208 is a minimum or maximum clamp function and the value of the "subfield-3" register write data either is less than the minimum value or exceeds the maximum value of the subfield-3 data value 242).

In some embodiments, each of subfield-1 220, subfield-2 230, and subfield-3 240 include a subfield function select (not shown) specific to the subfield. Thus, the subfield function select for each subfield is independent of the subfield function select for the other subfields. For example, in some embodiments the subfield select for subfield-1 220 is a replace function, while the subfield select for subfield-2 230 is a minimum clamp function and the subfield select for subfield-3 240 is a maximum clamp function.

Figure 3:
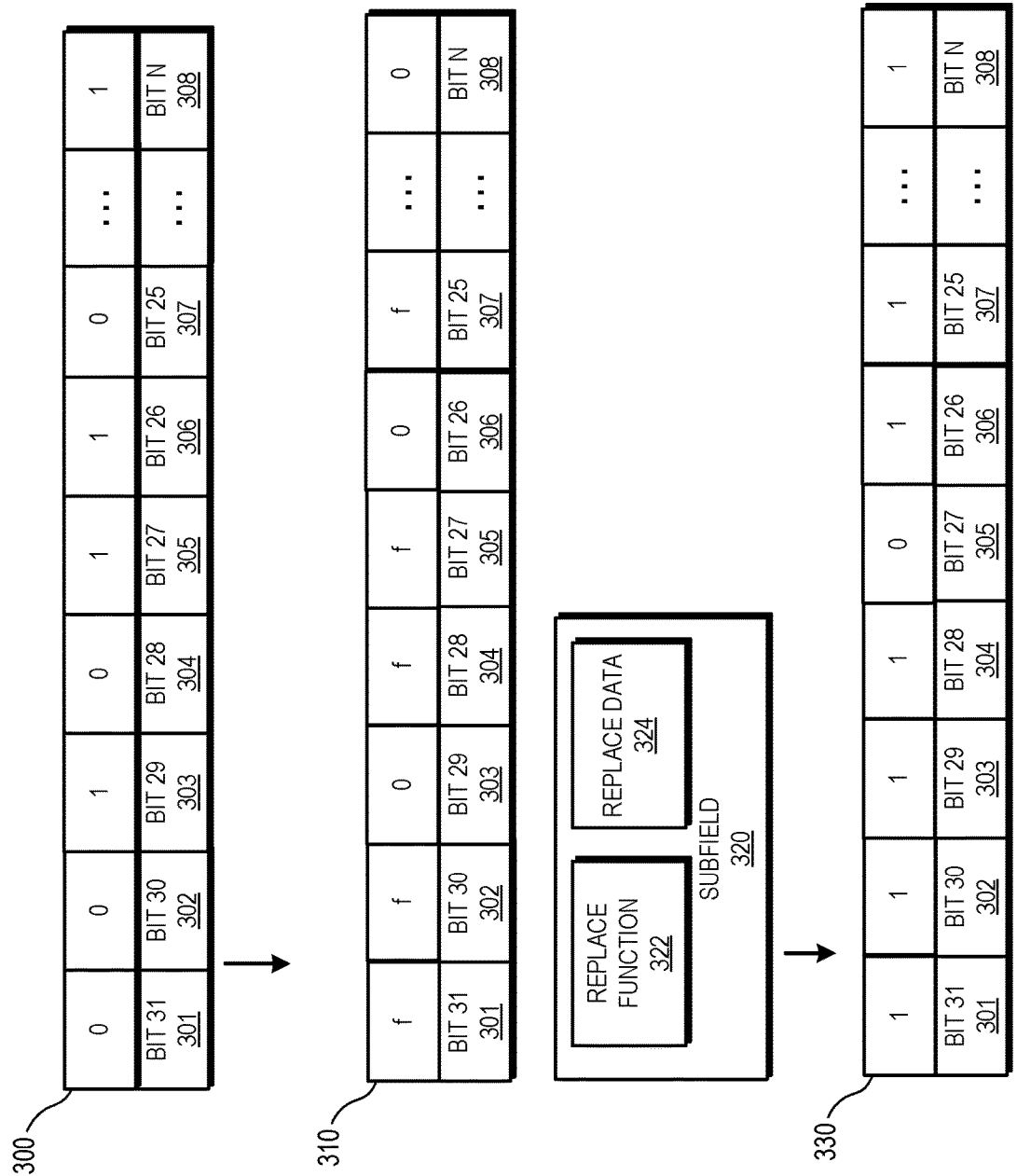
FIG. 3 illustrates a replace subfield function of the CAM of FIG. 2 replacing specified bits of a register write in accordance with some embodiments.

FIG. 3 illustrates a replace subfield function of the CAM 110 of FIG. 1 replacing specified bits of register write data 300 in accordance with some embodiments. In the illustrated example, the data mask 310 defines a subfield ranging from bit 31 (301) to bit N (308) of the register write data 300 in which bits that are to be modified are indicated with "f" and bits that are to remain unmodified are indicated with "0". In the illustrated example, register write data 300 includes bits having the following values: bit 31 (301) is 0, bit 30 (302) is 0, bit 29 (303) is 1, bit 28 (304) is 0, bit 27 (305) is 1, bit 26 (306) is 1, bit 25 (307) is 0, and bit N (308) is 1. The data mask 310 indicates that the following bits are to be modified: bit 31 (301), bit 30 (302), bit 28 (304), bit 27 (305), and bit 25 (307). The function select associated with the subfield 310 is a replace function 322, and the data values that are to replace the values of the bits 301-308 that the data mask 310 indicates are to be modified are provided as replace data 324. The CAM 110 replaces the register write data 300 with the replace data 324 to generate modified data 330. In the illustrated example, the replace data 324 has bit values that are flipped from those of register write data 300. Thus, for modified data 330, bit 31 (301) is flipped to 1, bit 30 (302) is flipped to 1, bit 29 (303) is left unmodified as 1, bit 28 (304) is flipped to 1, bit 27 (305) is flipped to 0, bit 26 (306) is left unmodified as 1, bit 25 (307) is flipped to 1, and bit N (308) is left unmodified as 1.

Figure 4:
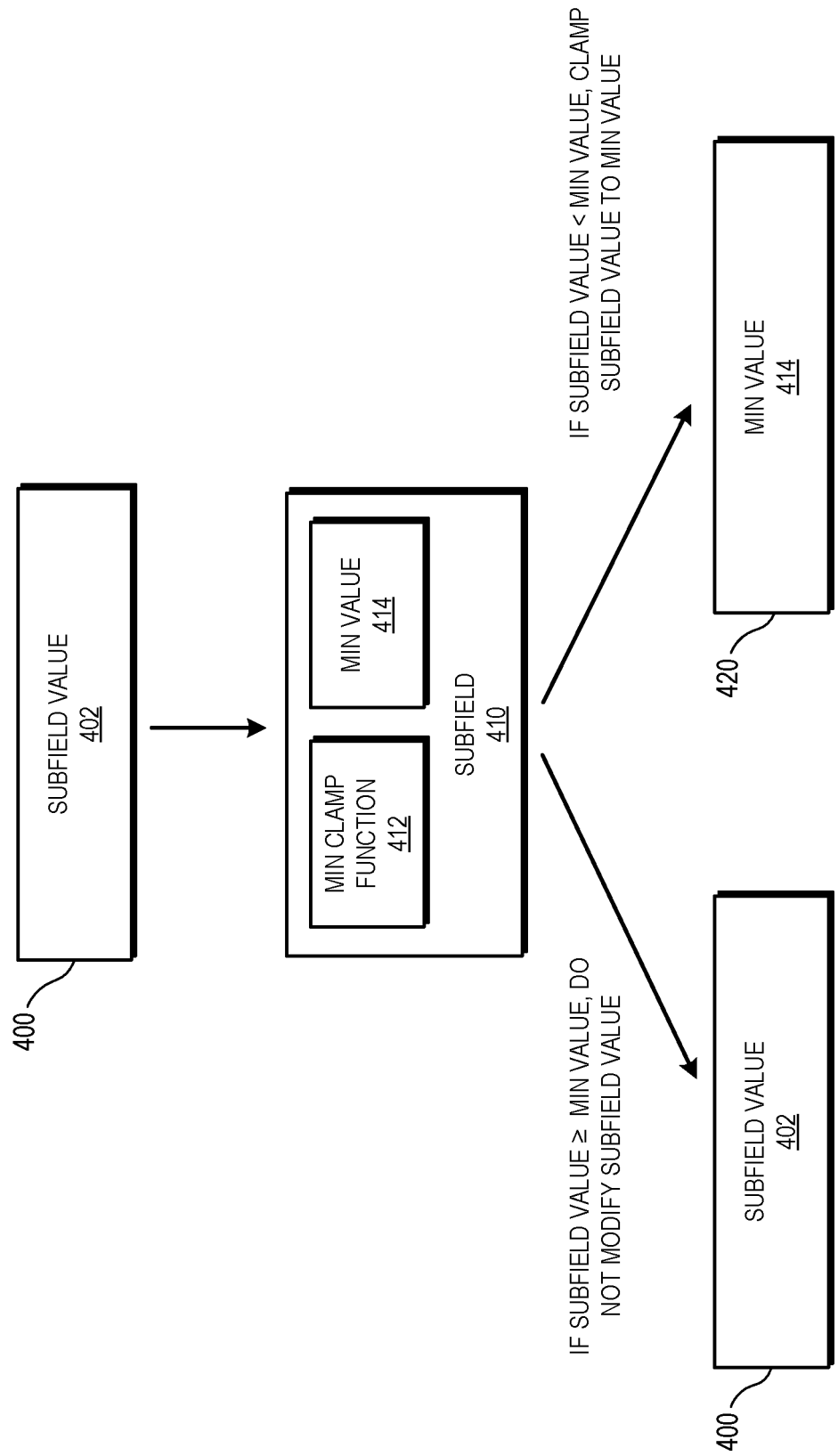
FIG. 4 illustrates a minimum clamp subfield function of the CAM of FIG. 2 clamping a subfield value of a register write to a minimum value in accordance with some embodiments.

FIG. 4 illustrates a minimum clamp subfield function of the CAM 110 of FIG. 1 clamping a subfield value 402 of register write data 400 to a minimum value 414 in accordance with some embodiments. In the illustrated example, the subfield 410 defined by the data mask for the entry of the CAM 110 that matches the register write data 400 has a function select that specifies a minimum clamp function 412 and a minimum value 414. The CAM 110 compares subfield value 402 of the register write data 400 to the minimum value 414. If the subfield value 402 is greater than or equal to the minimum value 414, the CAM 110 does not modify the subfield value 402 when it provides the register write data 400 to one or both of the registers 122, 132, depending on which pipelines are enabled. However, if the subfield value 402 is less than the minimum value 414, the CAM 110 clamps (sets) the subfield value 402 to the minimum value 414 and provides modified data 420 to one or both of the registers 122, 132.

Figure 5:
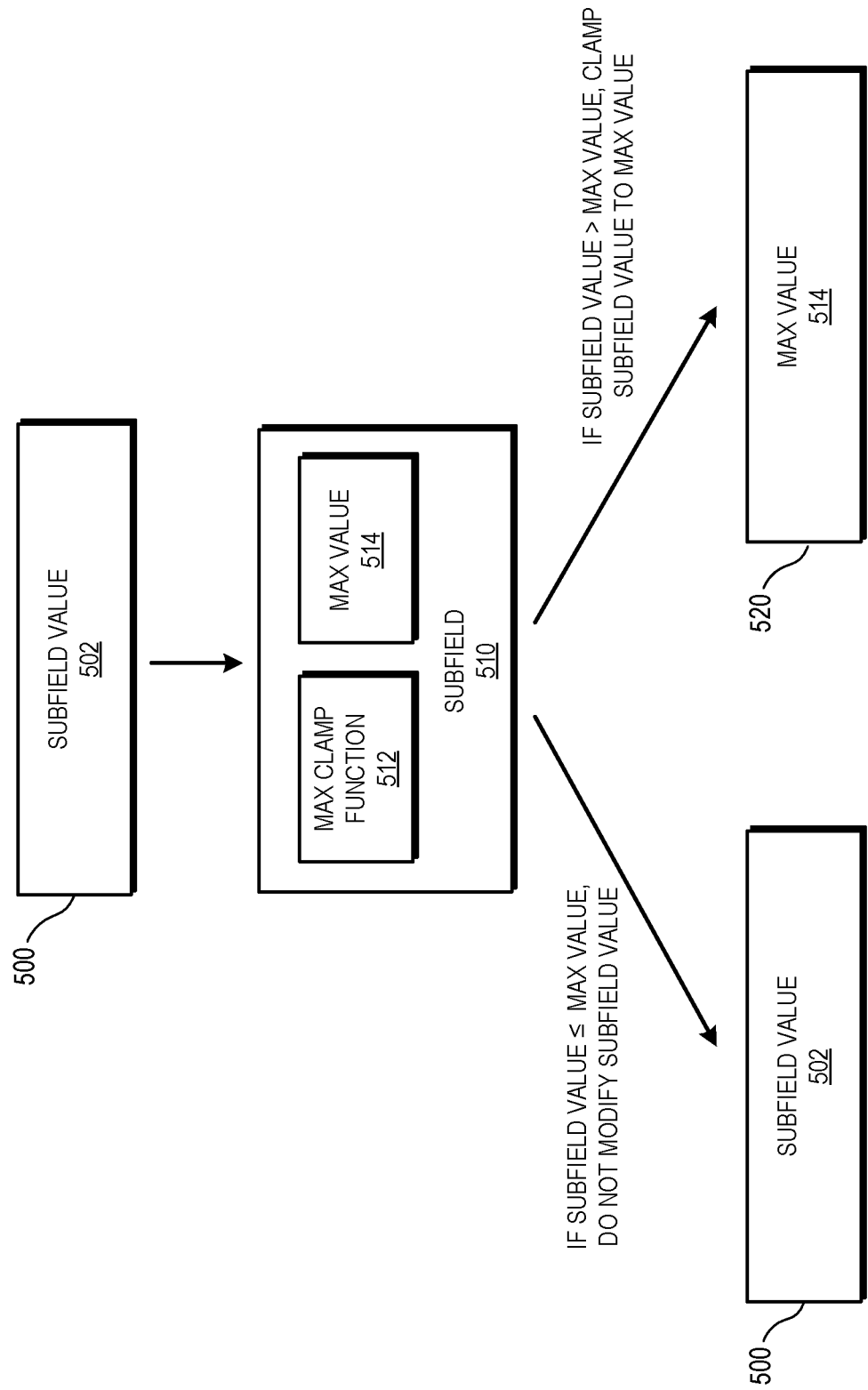
FIG. 5 illustrate a maximum clamp subfield function of the CAM of FIG. 2 clamping a subfield value of a register write to a maximum value in accordance with some embodiments.

FIG. 5 illustrate a maximum clamp subfield function of the CAM 110 of FIG. 1 clamping a subfield value 502 of register write data 500 to a maximum value 514 in accordance with some embodiments. In the illustrated example, the subfield 510 defined by the data mask for the entry of the CAM 110 that matches the register write data 500 has a function select that specifies a minimum clamp function 512 and a maximum value 514. The CAM 110 compares the subfield value 502 of the register write data 500 to the maximum value 514. If the subfield value 502 is less than or equal to the maximum value 514, the CAM 110 does not modify the subfield value 502 when it provides the register write data 500 to one or both of the registers 122, 132, depending on which pipelines are enabled. However, if the subfield value 502 is greater than the maximum value 514, the CAM 110 clamps (sets) the subfield value 502 to the maximum value 514 and provides modified data 520 to one or both of the registers 122, 132.

Figure 6:
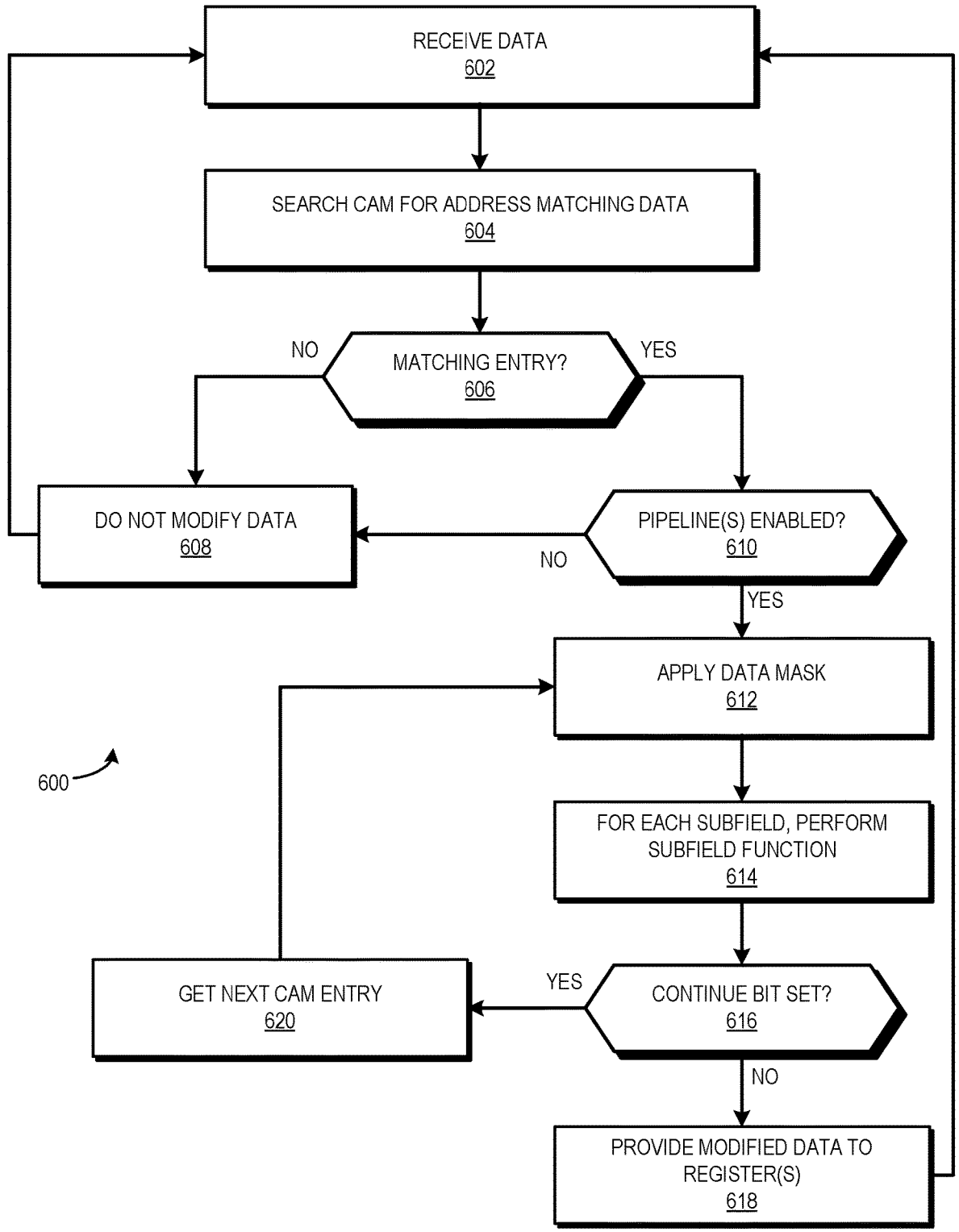
FIG. 6 is a flow diagram illustrating a method for modifying register writes on a per-pipe basis using the CAM of FIGS. 1-5 in accordance with some embodiments.

FIG. 6 is a flow diagram illustrating a method 600 for modifying register write data on a per-pipe basis using the CAM 110 of FIG. 1 in accordance with some embodiments. At block 602, the CAM 110 receives register write data 102. At block 604, the CAM 110 searches its entries for an entry having an address field that matches the address of the register write data 102. At block 606, the CAM 110 determines whether it includes a matching entry. If, at block 606, the CAM 110 does not include a matching entry, the method flow continues to block 608. At block 608, the CAM 110 refrains from modifying the register write data 102 and provides the unmodified register write data 102 to the registers 122, 132, and the method flow continues back to block 602 to receive the next register write data.

If, at block 606, the CAM 110 determines that it includes a matching entry, the method flow continues to block 610. At block 610, the CAM 110 determines whether the matching entry has a pipeline enable set for any pipeline. If a pipeline enable is not set for any pipeline, the method flow continues back to block 608, at which the CAM 110 refrains from modifying the register write data 102, and the method flow continues back to block 602 to receive the next register write data. If, at block 610, a pipeline enable is set for at least one pipeline, the method flow continues to block 612. At block 612, the CAM 110 applies a data mask associated with the matching entry of the CAM 110 to define one or more subfields of the register write data 102. At block 614, the CAM 110 performs the function specified by the function select on the bits of the register write data 102 corresponding to each subfield defined by the data mask. At block 616, the CAM 110 determines whether a continue bit is set for the matching entry. If, at block 616, the continue bit is not set, the method flow continues to block 618, at which the CAM 110 provides the modified data 112 to one or both of the registers 122, 132, depending on which pipeline enables were set. The method flow then continues back to block 602 to receive the next register write data.

If, at block 616, the CAM 110 determines that the continue bit was set, the method flow continues to block 620.

At block 620, the CAM 110 gets the next CAM 110 entry, after which the method flow continues back to block 612 to apply the data mask for the next CAM 110 entry. Once the CAM 110 has performed all functions for the register write data 102, at block 618 the CAM 110 provides the modified data 112 to one or both of the registers 122, 132. In some embodiments, the CAM 110 performs a first set of one or more functions on subfields of register write data 102 for pipeline 120 and performs a second set of one or more functions on subfield of register write data 102 for pipeline 130.

A computer readable storage medium includes any non-transitory storage medium, or combination of non-transitory storage media, accessible by a computer system during use to provide instructions and/or data to the computer system. Such storage media can include, but is not limited to, optical media (e.g., compact disc (CD), digital versatile disc (DVD), Blu-Ray disc), magnetic media (e.g., floppy disc, magnetic tape, or magnetic hard drive), volatile memory (e.g., random access memory (RAM) or cache), non-volatile memory (e.g., read-only memory (ROM) or Flash memory), or microelectromechanical systems (MEMS)-based storage media. The computer readable storage medium can be embedded in the computing system (e.g., system RAM or ROM), fixedly attached to the computing system (e.g., a magnetic hard drive), removably attached to the computing system (e.g., an optical disc or Universal Serial Bus (USB)-based Flash memory), or coupled to the computer system via a wired or wireless network (e.g., network accessible storage (NAS)).

In some embodiments, certain aspects of the techniques described above are implemented by one or more processors of a processing system executing software. The software includes one or more sets of executable instructions stored or otherwise tangibly embodied on a non-transitory computer readable storage medium. The software can include the instructions and certain data that, when executed by the one or more processors, manipulate the one or more processors to perform one or more aspects of the techniques described above. The non-transitory computer readable storage medium can include, for example, a magnetic or optical disk storage device, solid state storage devices such as Flash memory, a cache, random access memory (RAM) or other non-volatile memory device or devices, and the like. The executable instructions stored on the non-transitory computer readable storage medium can be in source code, assembly language code, object code, or other instruction format that is interpreted or otherwise executable by one or more processors.

In accordance with one aspect, a method includes receiving, at a processing system, first data associated with a first address to be written to a first register of the processing system. The method further includes comparing, at a content addressable memory (CAM) of the processing system, the first address to an address field of each entry of the CAM and, in response to determining that the first address matches the address field of an entry of the CAM, selectively modifying a value of the first data based on a function select associated with the entry of the CAM. The method also includes writing the modified value to the first register. In some embodiments, the method further includes applying a data mask associated with the entry of the CAM, the data mask defining one or more subfields of the first register, wherein each subfield includes subfield data having one or more bits.

In some embodiments, the method includes modifying the value of the first data by replacing values of bits of the first data corresponding to a first subfield of the data mask with the values of bits stored at the entry of the CAM in response to the function select specifying a replace function. In some embodiments, the method includes selectively modifying the value of the first data by setting the value of a first subfield of the first data corresponding to a first subfield of the entry of the CAM to a first value stored at the first subfield of the entry of the CAM in response to determining that the function select specifies a minimum clamp and determining that the value of the first subfield of the first data is less than the first value stored at the first subfield of the entry of the CAM. Further, in some embodiments, the CAM performs a first operation on a first subfield of the first data and performs a second operation on a second subfield of the first data in response to an indication that an additional operation is to be performed. In some embodiments, the CAM selectively modifies the value of the first data by modifying an address to which the first data is output to a register address for register writes that are to be discarded by the processing system.

In accordance with another aspect, a method includes receiving, at a CAM of a processing system, first data to be written to a register of the processing system and, in response to the first data matching an entry of the CAM, applying a data mask stored at the entry, the data mask defining one or more subfields of the first data, wherein each subfield includes subfield data having one or more bits. The method further includes performing a first operation on a first subfield of the first data based on a function select stored at the matching entry of the CAM. In some embodiments, the method also includes performing a second operation on a second subfield of the first data in response to an indication that an additional operation is to be performed. Further, in some embodiments, the method further includes selectively modifying the value of the first data for a first pipeline, based on an indication that the first pipeline is enabled, and selectively modifying the value of the first data for a second pipeline, based on an indication that the second pipeline is enabled.

In accordance with another aspect, a processing system includes a register, an interface configured to receive first data associated with a first address to be written to the register, and a CAM configured to compare the first address to an address field of each entry of the CAM. In response to determining that the first address matches the address field of an entry of the CAM, the CAM selectively modifies a value of the first data based on a function associated with the entry of the CAM and writes the modified value to the register.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed. Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter can be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above can be altered or modified and all such variations are considered within the scope of the disclosed subject matter. Accordingly, the protection sought herein is as set forth in the claims below.

What is claimed is:

1. A method comprising:
   receiving, at a processing system comprising a plurality of processing pipelines, first data associated with a first address to be written to a first register of the processing system;
   comparing, at a content addressable memory (CAM) of the processing system, the first address to an address field of each entry of the CAM;
   in response to determining that the first address matches the address field of an entry of the CAM, selectively modifying a value of the first data on a per-pipeline basis based on a function select associated with the entry of the CAM; and
   writing the modified value to the first register;
   wherein selectively modifying the value of the first data comprises selectively modifying the value of the first data for a first pipeline based on an indication that the first pipeline is enabled, and selectively modifying the value of the first data for a second pipeline based on an indication that the second pipeline is enabled.

2. The method of claim 1, further comprising:
   applying a data mask associated with the entry of the CAM, the data mask defining one or more subfields of the first register, wherein each subfield comprises subfield data comprising one or more bits.

3. The method of claim 2, wherein selectively modifying the value of the first data comprises replacing values of bits of the first data corresponding to a first subfield of the data mask with the values of bits of the subfield data stored at the entry of the CAM in response to the function select comprising a replace function.

4. The method of claim 2, wherein selectively modifying the value of the first data comprises setting the value of a first subfield of the first data corresponding to a first subfield of the entry of the CAM to a first value stored at the first subfield of the entry of the CAM in response to:
   determining that the function select comprises a minimum clamp; and
   determining that the value of the first subfield of the first data is less than the first value stored at the first subfield of the entry of the CAM.

5. The method of claim 2, wherein selectively modifying the value of the first data comprises setting the value of a first subfield of the first data corresponding to a first subfield of the entry of the CAM to a first value stored at the first subfield of the entry of the CAM in response to:
   determining that a first subfield function of the first subfield comprises a maximum clamp; and
   determining that the value of the first subfield of the first data is greater than the first value stored at the first subfield of the entry of the CAM.

6. The method of claim 2, wherein selectively modifying the value of the first data comprises performing a first operation on a first subfield of the first data and performing a second operation on a second subfield of the first data in response to an indication that an additional operation is to be performed.

7. The method of claim 1, wherein selectively modifying the value of the first data comprises:
modifying an address to which the first data is output to a register address for register writes that are to be discarded by the processing system.

8. A method, comprising:
receiving, at a content addressable memory (CAM) of a processing system comprising a plurality of processing pipelines, first data to be written to a register of the processing system;
in response to the first data matching an entry of the CAM, applying a data mask stored at the entry, the data mask defining one or more subfields of the first data, wherein each subfield comprises subfield data comprising one or more bits; and
performing a first operation on a first subfield of the first data on a per-pipeline basis based on a first function select stored at the matching entry of the CAM, the first operation comprising selectively modifying the value of the first data for a first pipeline based on an indication that the first pipeline is enabled, and selectively modifying the value of the first data for a second pipeline based on an indication that the second pipeline is enabled.

9. The method of claim 8, further comprising:
performing a second operation on a second subfield of the first data in response to an indication that an additional operation is to be performed.

10. The method of claim 8, wherein performing the first operation comprises replacing values of bits of the first data corresponding to the first subfield of the data mask with the values of bits stored at the entry of the CAM in response to the first function select comprising a replace function.

11. The method of claim 8, wherein performing the first operation comprises setting the value of the first subfield of the first data corresponding to a first subfield of the entry of the CAM to a first value stored at the first subfield of the entry of the CAM in response to:
determining that the first function select comprises a minimum clamp; and determining that the value of the first subfield of the first data is less than the first value stored at the first subfield of the entry of the CAM.

12. The method of claim 8, wherein performing the first operation comprises setting the value of the first subfield of the first data corresponding to a first subfield of the entry of the CAM to a first value stored at the first subfield of the entry of the CAM in response to:
determining that the first function select comprises a maximum clamp; and
determining that the value of the first subfield of the first data is greater than the first value stored at the first subfield of the entry of the CAM.

13. A processing system comprising a plurality of processing pipelines, comprising:
a register;
an interface configured to receive first data associated with a first address to be written to the register; and
a content addressable memory (CAM) configured to:
compare the first address to an address field of each entry of the CAM;
in response to determining that the first address matches the address field of an entry of the CAM, selectively modify a value of the first data on a per-pipeline basis based on a function select associated with the entry of the CAM, wherein to selectively modify the value of the first data includes to selectively modify the value of the first data for a first pipeline based on an indication that the first pipeline is enabled, and to selectively modify the value of the first data for a second pipeline based on an indication that the second pipeline is enabled; and
write the modified value to the register.

14. The processing system of claim 13, wherein the CAM is further configured to:
apply a data mask associated with the entry of the CAM, the data mask defining one or more subfields of the register, wherein each subfield comprises a subfield data comprising one or more bits.

15. The processing system of claim 14, wherein the CAM is further configured to: selectively modify the value of the first data by replacing values of bits of the first data corresponding to a first subfield of the data mask with the values of bits stored at the entry of the CAM in response to the function select comprising a replace function.

16. The processing system of claim 14, wherein the CAM is further configured to: selectively modify the value of the first data by setting the value of a first subfield of the first data corresponding to a first subfield of the entry of the CAM to a first value stored at the first subfield of the entry of the CAM in response to:
determining that the function select comprises a minimum clamp; and
determining that the value of the first subfield of the first data is less than the first value stored at the first subfield of the entry of the CAM.

17. The processing system of claim 14, wherein the CAM is further configured to: selectively modify the value of the first data by setting the value of a first subfield of the first data corresponding to a first subfield of the entry of the CAM to a first value stored at the first subfield of the entry of the CAM in response to:
determining that the function select comprises a maximum clamp; and
determining that the value of the first subfield of the first data is greater than the first value stored at the first subfield of the entry of the CAM.

18. The processing system of claim 14, wherein the CAM is further configured to: selectively modify the value of the first data by performing a first operation on a first subfield of the first data and performing a second operation on a second subfield of the first data in response to an indication that an additional operation is to be performed.

* * * * *